US009480173B2

(12) United States Patent
Ishihara et al.

(10) Patent No.: US 9,480,173 B2
(45) Date of Patent: Oct. 25, 2016

(54) FLEX-RIGID WIRING BOARD AND METHOD FOR MANUFACTURING FLEX-RIGID WIRING BOARD

(71) Applicant: IBIDEN Co., Ltd., Ogaki-shi (JP)

(72) Inventors: Teruyuki Ishihara, Ogaki (JP); Michimasa Takahashi, Ogaki (JP); Takashi Kariya, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

(21) Appl. No.: 14/522,742

(22) Filed: Oct. 24, 2014

(65) Prior Publication Data

US 2015/0114689 A1      Apr. 30, 2015

(30) Foreign Application Priority Data

Oct. 24, 2013 (JP) ................................ 2013-221397

(51) Int. Cl.
| | |
|---|---|
| H05K 1/11 | (2006.01) |
| H05K 1/02 | (2006.01) |
| H05K 3/46 | (2006.01) |
| H05K 3/36 | (2006.01) |

(52) U.S. Cl.
CPC ..... *H05K 3/4691* (2013.01); *H05K 2201/0187* (2013.01); *H05K 2203/308* (2013.01)

(58) Field of Classification Search
CPC ...... G02B 6/43; H05K 1/0274; H05K 1/028; H05K 1/0298; H05K 1/118
USPC .......... 257/E23.068, E23.079, 666; 174/251, 174/254, 264
See application file for complete search history.

(56) References Cited

U.S. PATENT DOCUMENTS

| | | | |
|---|---|---|---|
| 8,383,948 B2 | 2/2013 | Aoyama et al. | |
| 2001/0013425 A1* | 8/2001 | Rokugawa | ........ H01L 23/49811 174/262 |
| 2011/0036619 A1* | 2/2011 | Uratsuji | ............... H05K 1/0218 174/254 |

FOREIGN PATENT DOCUMENTS

JP      4021472 B1      10/2007

OTHER PUBLICATIONS

U.S. Appl. No. 14/522,768, filed Oct. 24, 2014, Ishihara et al.

* cited by examiner

*Primary Examiner* — Errol Fernandes
*Assistant Examiner* — Brian Turner
(74) *Attorney, Agent, or Firm* — Oblon, McClelland, Maier & Neustadt, L.L.P.

(57) ABSTRACT

A flex-rigid wiring board includes a flexible substrate, a non-flexible substrate positioned such that the non-flexible substrate is extending in horizontal direction of the flexible substrate, a first wiring layer formed on first surfaces of the flexible and non-flexible substrates, a second wiring layer embedded in second surfaces of the flexible and non-flexible substrates, a first insulating layer covering the first surfaces of the flexible and non-flexible substrates and having an opening exposing a portion of the first surface of the flexible substrate, and a second insulating layer covering the second surfaces of the flexible and non-flexible substrates and having an opening exposing a portion of the second surface of the flexible substrate. The first wiring layer includes non-embedded wirings on the first surfaces of the flexible and non-flexible substrates, and the second wiring layer includes embedded wirings in the second surfaces of the flexible and non-flexible substrates.

20 Claims, 11 Drawing Sheets

FLEX-RIGID WIRING BOARD AND METHOD FOR MANUFACTURING FLEX-RIGID WIRING BOARD

CROSS-REFERENCE TO RELATED APPLICATIONS

The present application is based upon and claims the benefit of priority to Japanese Patent Application No. 2013-221397, filed Oct. 24, 2013, the entire contents of which are incorporated herein by reference.

BACKGROUND OF THE INVENTION

1. Field of the Invention

The present invention relates to a bendable flex-rigid wiring board of which a portion is formed from a flex substrate and a manufacturing method thereof.

2. Description of Background Art

A flex-rigid wiring board of which a portion of a substrate has rigidity and another portion of the substrate has flexibility is described, for example, in Japanese Patent No. 4021472. The entire contents of this publication are incorporated herein by reference.

SUMMARY OF THE INVENTION

According to one aspect of the present invention, a flex-rigid wiring board includes a flexible substrate, a non-flexible substrate positioned such that the non-flexible substrate is extending in a horizontal direction of the flexible substrate, a first wiring layer formed on first surfaces of the flexible substrate and non-flexible substrate, a second wiring layer embedded in second surfaces of the flexible substrate and non-flexible substrate, a first insulating layer covering the first surface of the flexible substrate and the first surface of the non-flexible substrate and having an opening portion exposing at least a portion of the first surface of the flexible substrate, and a second insulating layer covering the second surface of the flexible substrate and the second surface of the non-flexible substrate and having an opening portion exposing at least a portion of the second surface of the flexible substrate. The first wiring layer includes non-embedded wirings formed on the first surfaces of the flexible substrate and non-flexible substrate, and the second wiring layer includes embedded wirings embedded in the second surfaces of the flexible substrate and non-flexible substrate.

According to another aspect of the present invention, a method for manufacturing a flex-rigid wiring board includes forming on a support plate a second wiring layer having a conductor pattern, positioning on the support plate a flexible substrate and a non-flexible substrate such that the non-flexible substrate is extending in a horizontal direction of the flexible substrate, embedding the second wiring layer into second surfaces of the flexible substrate and non-flexible substrate, forming a first wiring layer on first surfaces of the flexible substrate and non-flexible substrate on the opposite side with respect to the second surfaces of the flexible substrate and non-flexible substrate, and removing the support plate from the second surfaces of the flexible substrate and non-flexible substrate. The first wiring layer includes non-embedded wirings formed on the first surfaces of the flexible substrate and non-flexible substrate, and the second wiring layer includes embedded wirings embedded in the second surfaces of the flexible substrate and non-flexible substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

The embodiments will now be described with reference to the accompanying drawings, wherein like reference numerals designate corresponding or identical elements throughout the various drawings.

Figure 1:
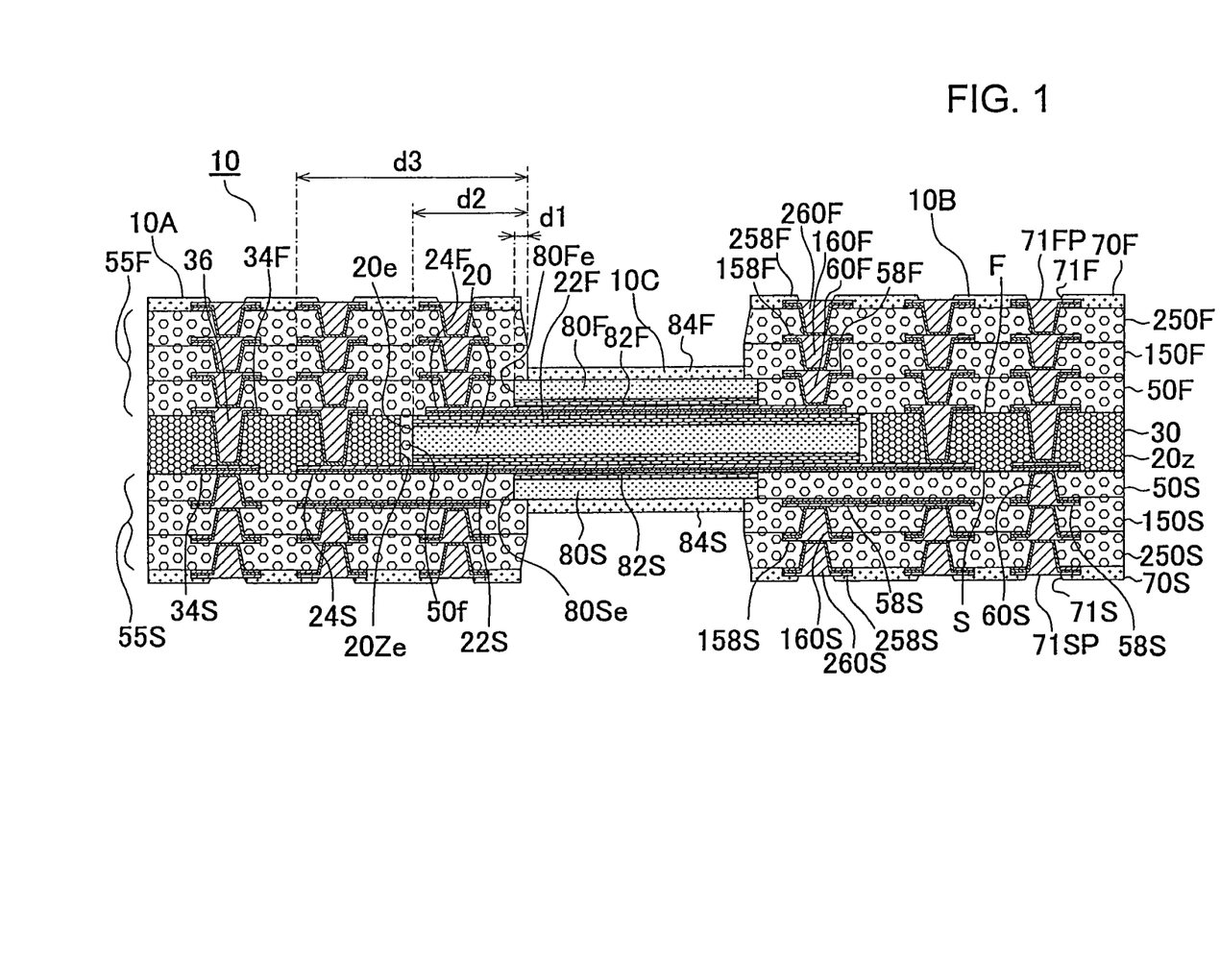
FIG. 1 illustrates a cross-sectional view of a flex-rigid wiring board according to a first embodiment of the present invention.

FIG. 1 illustrates a cross-sectional view of a flex-rigid wiring board according to a first embodiment.

The flex-rigid wiring board is formed from a first rigid substrate (10A) that does not have flexibility, a second rigid substrate (10B) that does not have flexibility, and a flex substrate (flexible substrate) (10C) that connects the first rigid substrate (10A) and the second rigid substrate (10B) and has flexibility. The first rigid substrate (10A) and the second rigid substrate (10B) are bendable via the flex substrate (10C). On the first rigid substrate (10A) and the second rigid substrate (10B), an arbitrary circuit pattern is formed. Further, as needed, an electronic part such as a semiconductor chip is connected.

The first rigid substrate (10A) and the second rigid substrate (10B) have a core substrate 30 that is formed by: an insulating substrate (20z) having a first surface (F) and a second surface (S) that is on an opposite side of the first surface; a first conductor layer (34F) that is formed on the first surface of the insulating substrate; a second conductor layer (34S) that is formed on the second surface (S) of the insulating substrate; and a via conductor 36 that connects the first conductor layer (34F) and the second conductor layer (34S). The insulating substrate has a reinforcing material such as glass cloth and organic fibers. Here, the via conductor is provided. However, in place of the via conductor, it is also possible to provide a through-hole conductor and a conductor bump.

An upper side build-up layer (55F) is formed on the first surface (F) and the first conductor layer (34F), of the core substrate 30. The upper side build-up layer at least has an uppermost interlayer resin insulating layer (250F), an uppermost conductor layer (258F) on the uppermost interlayer resin insulating layer, and an uppermost via conductor (260F) that penetrates through the uppermost interlayer resin insulating layer and electrically connects the uppermost conductor layer and a middle-layer conductor layer (158F). The upper side build-up layer further has a middle-layer interlayer resin insulating layer (150F), the middle-layer conductor layer (158F) on the middle-layer interlayer resin insulating layer, and a middle-layer via conductor (160F) that penetrates through the middle-layer interlayer resin insulating layer and electrically connects the middle-layer conductor layer and an upper side conductor layer (58F). The upper side build-up layer further has an upper side interlayer resin insulating layer (50F) between the middle-layer interlayer resin insulating layer and the core substrate, the upper side conductor layer (58F) on the upper side interlayer resin insulating layer, and an upper side via conductor (60F) that penetrates through the upper side interlayer resin insulating layer and connects the upper side conductor layer and the first conductor layer (34F) of the core substrate.

A lower side build-up layer (55S) is formed on the second surface (S) of the core substrate 30. The lower side build-up layer at least has a lowermost interlayer resin insulating layer (250S), a lowermost conductor layer (258S) on the lowermost interlayer resin insulating layer, and a lowermost via conductor (260S) that penetrates through the lowermost interlayer resin insulating layer and electrically connects the lowermost conductor layer and a middle-layer conductor layer (158S). The lower side build-up layer further has a middle-layer interlayer resin insulating layer (150S), the middle-layer conductor layer (158S) on the middle-layer interlayer resin insulating layer, and a middle-layer via conductor (160S) that penetrates through the middle-layer interlayer resin insulating layer electrically connects the middle-layer conductor layer and a lower side conductor layer (58S). The lower side build-up layer further has a lower side interlayer resin insulating layer (50S) between the middle-layer interlayer resin insulating layer (158S) and the core substrate 30, the lower side conductor layer (58S) on the lower side interlayer resin insulating layer, and a lower side via conductor (60S) that penetrates through the lower side interlayer resin insulating layer and connects the lower side conductor layer and the second conductor layer. The first surface of the core substrate and the first surface of the insulating substrate are the same surface; and the second surface of the core substrate and the second surface of the insulating substrate are the same surface.

An upper side solder resist layer (70F) is formed on the upper side build-up layer, and a lower side solder resist layer (70S) is formed on the lower side build-up layer. The solder resist layer (70F) has an opening (71F) that exposes the uppermost conductor layer and the uppermost via conductor; and the solder resist layer (70S) has an opening (71S) that exposes the lowermost conductor layer and the lowermost via conductor. Conductor portions that are exposed by the openings function as pads (71FP, 71SP).

The flex substrate (10C) is provided with a base material 20 that is made of a polyimide sheet having a first surface (F) and a second surface (S) that is on an opposite side of the first surface (F), a first wiring layer (24F) that is formed via a bonding layer (22F) that is provided on the first surface side of the base material 20, and a second wiring layer (24S) that is formed via a bonding layer (22S) that is provided on the second surface side of the base material 20. A coverlay (covering layer) (80F) covers via a bonding layer (82F) on the first wiring layer (24F). A solder resist layer (84F) is formed on the coverlay (80F). A coverlay (covering layer) (80S) covers via a bonding layer (82S) on the second wiring layer (24S). A solder resist layer (84S) is formed on the coverlay (80S). The coverlays (80F, 80S) are formed from insulating films of polyimide and the like.

The coverlays (80F, 80S) enter into the first rigid substrate (10A) and the second rigid substrate (10B) for about d1 (50 μm or more). On the other hand, the base material 20 enters into the first rigid substrate (10A) and the second rigid substrate (10B) for d2 (100 μm or more). The second wiring layer (24S) enters the first rigid substrate (10A) and the second rigid substrate (10B) for d3 (150 μm or more). The entering amount (d1) of the coverlays (80F, 80S) into the first rigid substrate (10A) and the second rigid substrate (10B) is a minimum required amount for the coverlays (80F, 80S) not to be disengaged from the first rigid substrate (10A) and the second rigid substrate (10B) when a stress is applied to the flex substrate. There is a gap between an end part (20e) of the base material 20 and an end part (20Ze) of the insulating substrate (20z). Resin (50f) is filled in the gap.

Figure 11A:
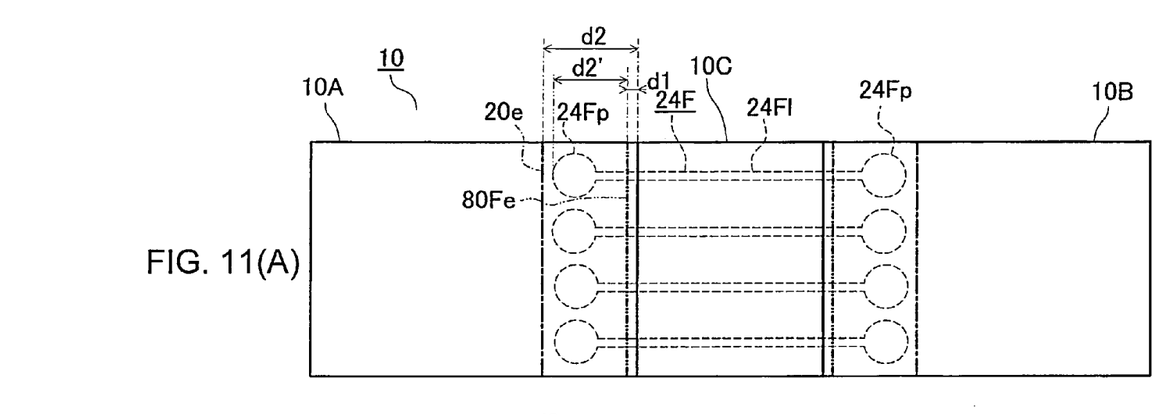
FIG. 11(A) illustrates a plan view of the flex-rigid wiring board of the first embodiment.

FIG. 11A illustrates a plan view of a flex-rigid wiring board 10.

The first wiring layer (24F) is formed from pad parts (24Fp) that connect to the via conductor (60F) that is formed on the upper side interlayer resin insulating layer (50F) of the first rigid substrate (10A) and the second rigid substrate (10B), and line parts (24Fl) that each connect the pad parts (24Fp) (pad part (24Fp)—pad part (24Fp)) at two ends. The first wiring layer (24F) is exposed for a length (d2') from an end part (80Fe) of the coverlay (80F). The length (d2') corresponds to a diameter of the pad part (24Fp) and a portion of a length of the line part (24Fl).

Figure 11B:
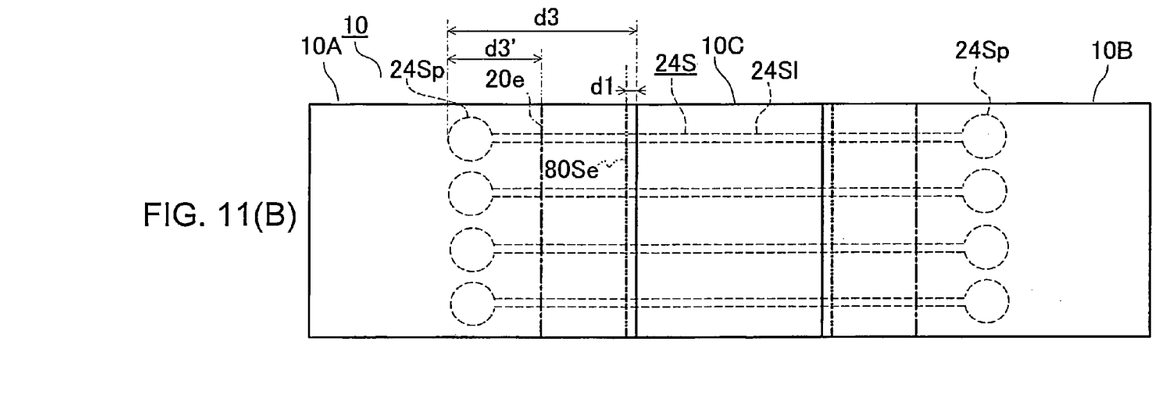
FIG. 11(B) illustrates a bottom view of the flex-rigid wiring board of the first embodiment.

FIG. 11B illustrates a bottom view of the flex-rigid wiring board 10.

The second wiring layer (24S) is formed from pad parts (24Sp) that connect to the via conductor (60S) that is formed on the lower side interlayer resin insulating layer (50S) of the first rigid substrate (10A) and the second rigid substrate (10B), and line parts (24Sl) that each connect the pad parts (24Sp) (pad part (24Sp)—pad part (24Sp)) at two ends. The second wiring layer (24S) is exposed for a length (d3') from the end part (20e) of the base material 20. The length (d3') corresponds to a diameter of the pad part (24Sp) and a portion of a length of the line part (24Sl).

In the flex-rigid wiring board of the first embodiment, the pad parts (24Fp) of the first wiring layer (24F) are exposed from the coverlay (80F), and the via conductor (60F) that penetrates through the upper side interlayer resin insulating layer (50F) connects to the pad parts (24Fp). Further, the pad parts (24Sp) of the second wiring layer (24S) are exposed from the coverlay (80S), and the via conductor 36 that is provided in the core substrate connects to the pad parts (24Sp). That is, the via conductors (60F, 60S) do not penetrate through the coverlay and the interlayer resin insulating layer, but only penetrate through the interlayer resin insulating layer. Therefore, the pad parts of the via conductor can be miniaturized and the flex-rigid wiring board can be formed to have a fine pitch. Without penetrating through the coverlay, the via conductor penetrates through only the interlayer resin insulating layer. Therefore, the coverlay does not significantly enter into the rigid substrates so that interlayer variations of the rigid substrates are reduced, and further, restriction in wiring design in order to avoid the coverlay is reduced.

The second wiring layer (24S) is exposed (extended) for the length (d3') from the end part (20e) of the base material 20. Therefore, direct connection by the via conductor 36 that is provided in the core substrate 30 to the pad parts (24Sp) of the second wiring layer (24S) is possible. Therefore, a wiring length between the second wiring layer (24S) and the first surface side of the first rigid substrate (10A) and the second rigid substrate (10B) can be shortened. Here, similar to the second wiring layer (24S), the first wiring layer (24F) may be extended from the end part (20e) of the base material 20.

FIGS. 2-10 illustrate a manufacturing process of a flex-rigid wiring board of the first embodiment. A method for manufacturing the flex-rigid wiring board 10 is described in the following.

(1) A copper foil 16 is laminated on a copper foil of a carrier (12z) that is formed from a double-sided copper-clad laminated plate that is formed by laminating copper foils 14 on both sides of an insulating base material 12 (FIG. 1A).

(2) A plating layer is formed on the copper foil 16; a resist mask (not illustrated in the drawings) is formed to perform patterning; and the second wiring layer (24S) and the second conductor layer (34S) that are illustrated in FIG. 11B are formed (FIG. 1B).

Figure 2A:
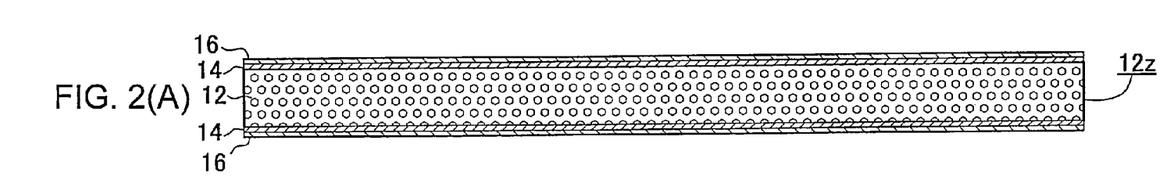
FIG. 2(A)-2(C) illustrate manufacturing process diagrams of the flex-rigid wiring board of the first embodiment.
Figures 2B, 2C:
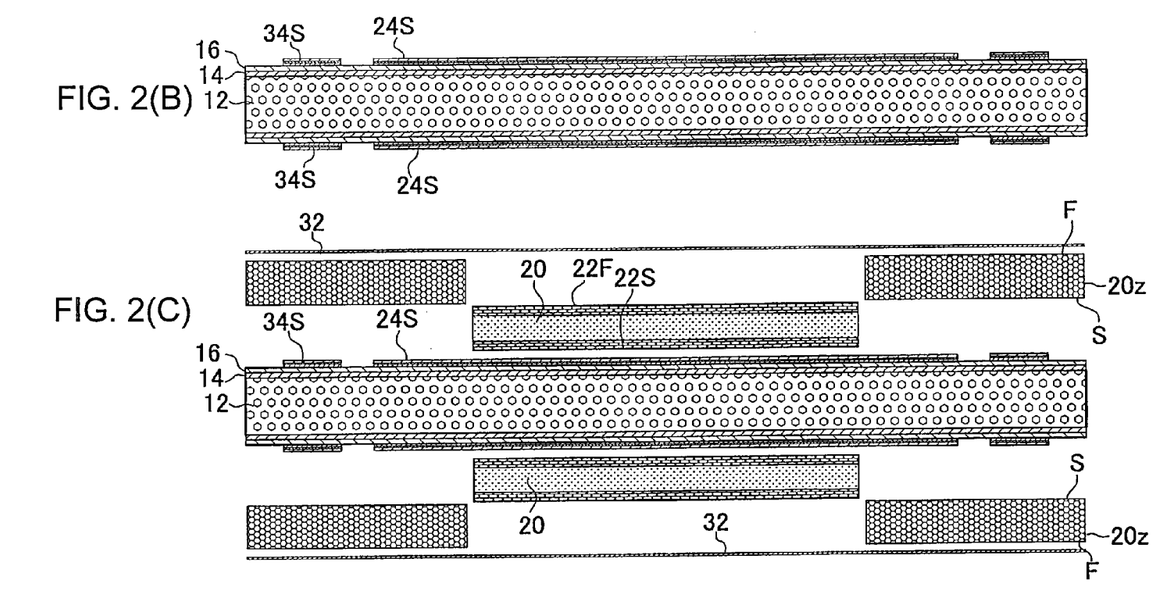
Figure 3A:
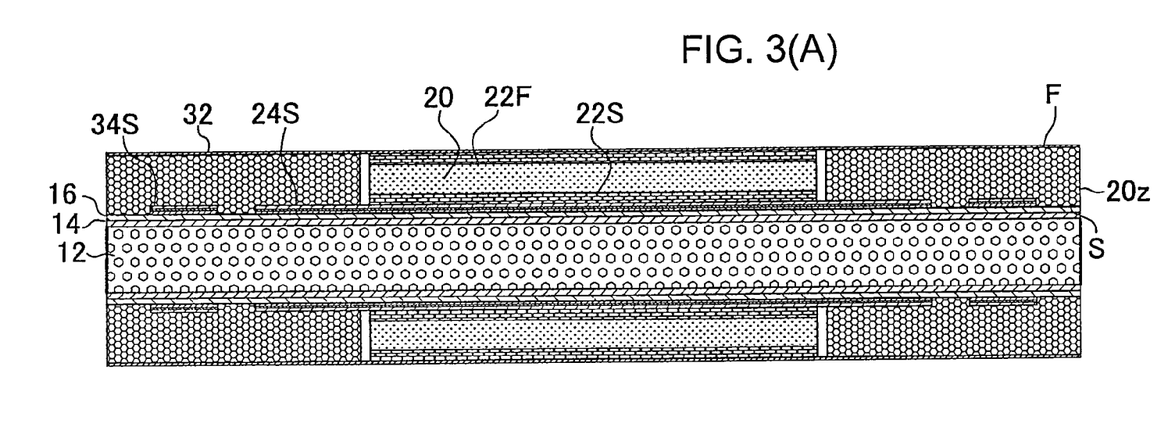
FIGS. 3(A) and 3(B) illustrate manufacturing process diagrams of the flex-rigid wiring board of the first embodiment.

(3) On a central part of the second conductor layer (34S), a base material 20, on both sides of which bonding layers (22F, 22S) are provided, is arranged; on two end parts of the insulating base material 12, an insulating substrate (20z) that is formed from prepreg and forms a core substrate of a first rigid substrate, is arranged; and further, a copper foil 32 is arranged (FIG. 2C). These are laminated (FIG. 3A). In this process, the second wiring layer (24S) and the second conductor layer (34S) are embedded in the bonding layer (22S) and the insulating substrate (20z).

Figure 3B:
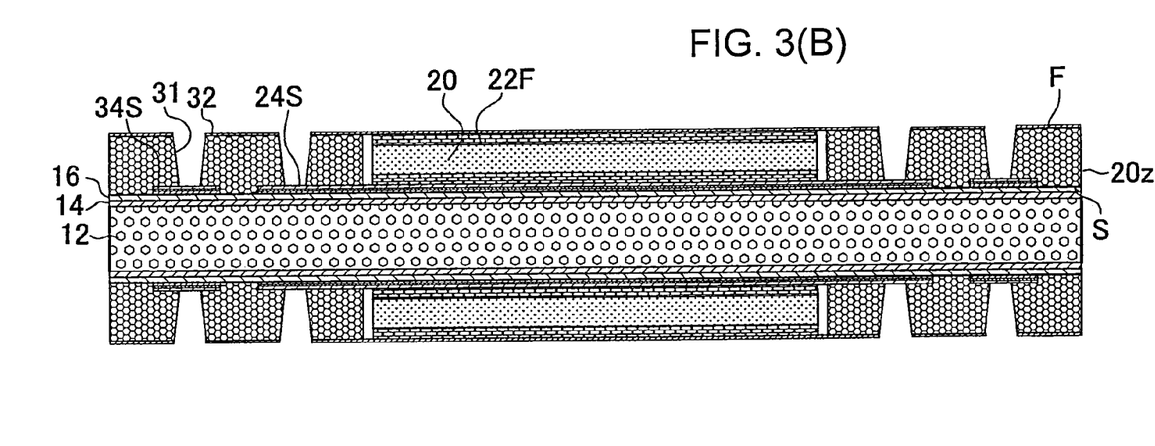

(4) At predetermined positions of the insulating substrate (20z), openings 31 for vias are formed using laser (FIG. 3B).

Figure 4A:
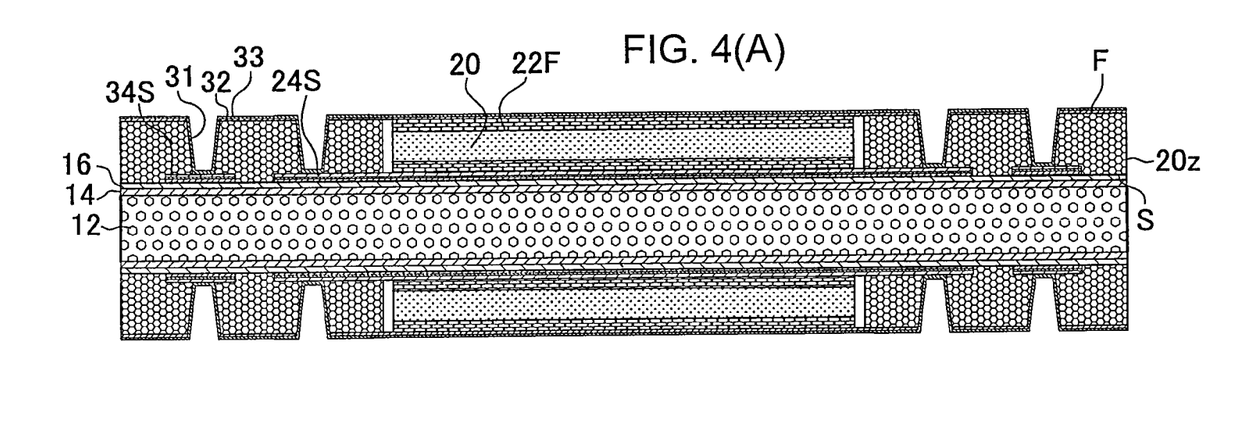
FIGS. 4(A) and 4(B) illustrate manufacturing process diagrams of the flex-rigid wiring board of the first embodiment.

(5) An electroless plating film 33 is formed on the copper foil 32 and in the openings 31 by an electroless plating process (FIG. 4A).

Figure 4B:
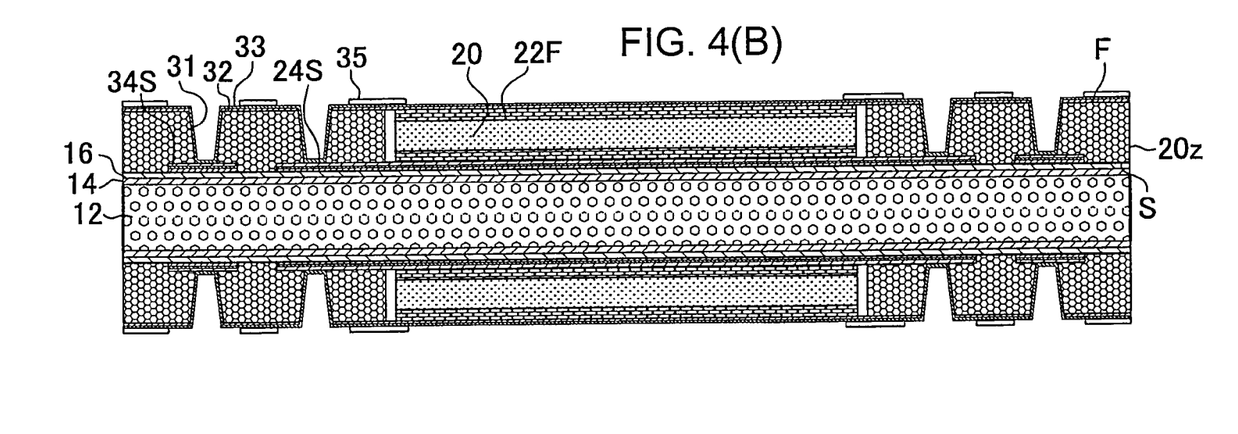

(6) A plating resist 35 of a predetermined pattern is formed on the electroless plating film 33 (FIG. 4B).

Figure 5A:
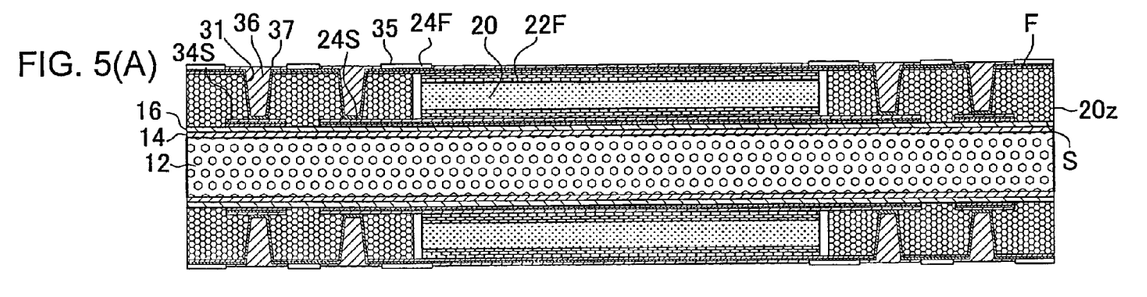
FIG. 5(A)-5(C) illustrate manufacturing process diagrams of the flex-rigid wiring board of the first embodiment.

(7) By an electrolytic plating process, an electrolytic plating film 37 is formed in a non-forming part of the plating resist 35, and a via conductor 36 is formed by the electrolytic plating film in the opening 31 (FIG. 5A).

Figure 5B:
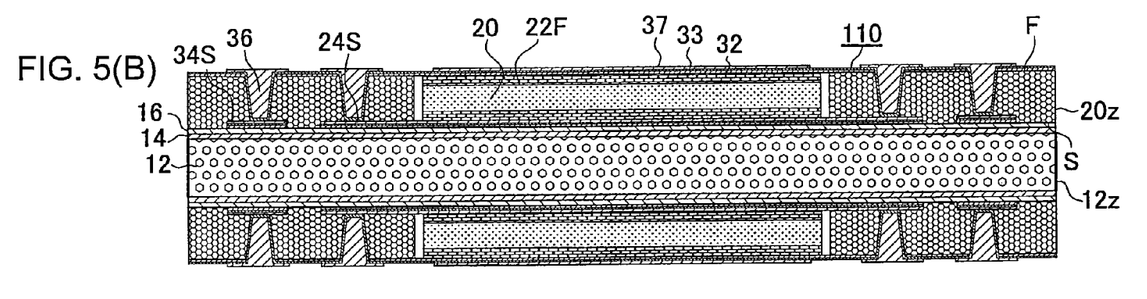

(8) The plating resist is peeled off (FIG. 5B).

Figure 5C:
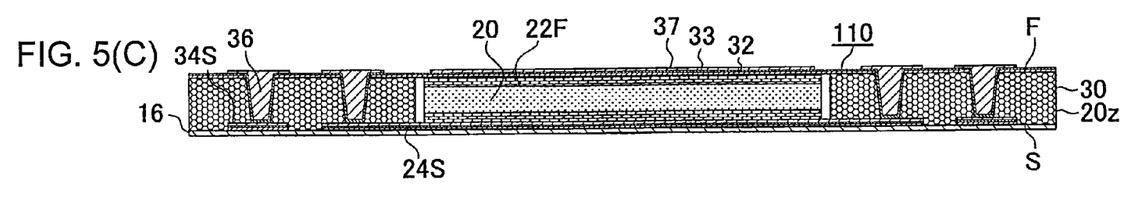

(9) An intermediary body 110 that is formed from the insulating substrate (20z) and the base material 20 is separated from the carrier 12z (FIG. 5C).

Figure 6A:
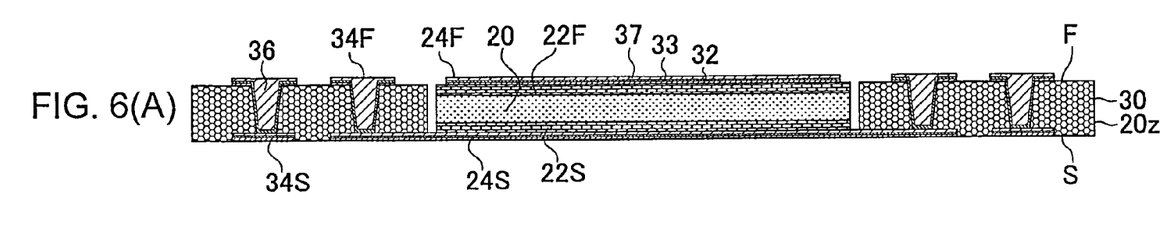
FIG. 6(A)-6(C) illustrate manufacturing process diagrams of the flex-rigid wiring board of the first embodiment.

(10) The electroless plating film 33 and the copper foil 32 that are exposed from the electrolytic plating film 37 on the first surface (F) side are removed by etching, and a first wiring layer (24F) and a first conductor layer (34F) that are formed from the electrolytic plating film 37, the electroless plating film 33 and the copper foil 32 are formed. Further, on the second surface (S) side, the copper foil 16 is removed, and the second wiring layer (24S) and the second conductor layer (34S) are exposed (FIG. 6A). The first wiring layer (24F) and the first conductor layer (34F) are exposed from the insulating substrate (20z) and the bonding layer (22F).

The second wiring layer (24S) and the second conductor layer (34S) are embedded in the insulating substrate (20z) and the bonding layer (22S).

Figure 6B:
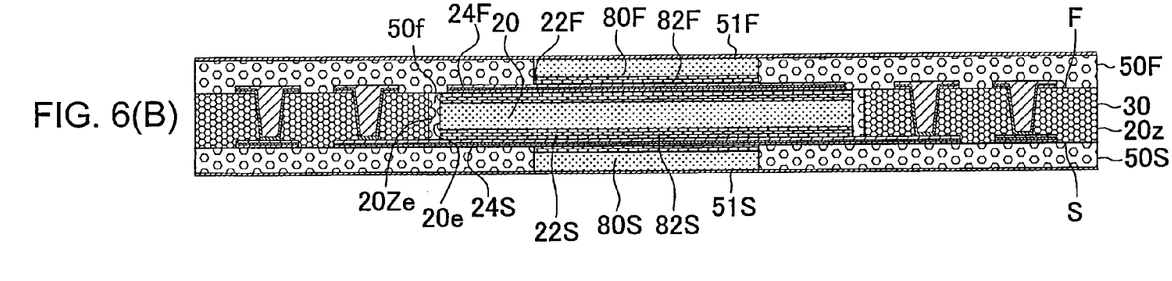

(12) A coverlay (80F) is laminated via a bonding layer (82F) on a central part of the first wiring layer (24F); a coverlay (80S) is laminated via a bonding layer (82S) on a central part of the second wiring layer (24S); an interlayer resin insulating layer (50F) that is formed from prepreg is laminated on the first surface (F) side of the insulating substrate (20z) and end parts of the first wiring layer (24F); an interlayer resin insulating layer (50S) that is formed from prepreg is laminated on the second surface (S) side of the insulating substrate (20z) and end parts of the second wiring layer (24S); and further, copper foils (51F, 51S) are laminated (FIG. 6B). Resin (50f) that exudes from the interlayer resin insulating layer (50F) is filled in a gap between an end part (20e) of the base material 20 and an end part (20Ze) of the insulating substrate (20z).

Figure 6C:
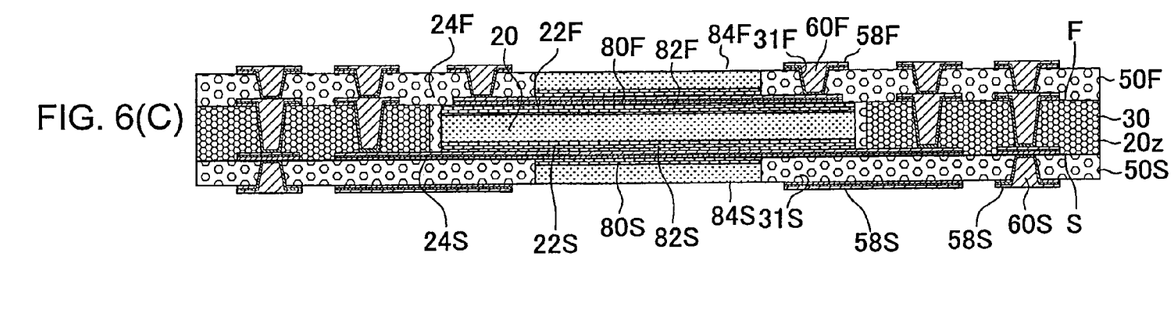

(13) At predetermined positions of the interlayer resin insulating layer (50F), openings (31F) for vias are formed using laser; openings (31S) are formed in the interlayer resin insulating layer (50S); in processes similar to (5)-(10), an electroless plating film is formed; a plating resist is formed; an electrolytic plating film is formed in a non-forming part of the plating resist; after peeling off the plating resist, the electroless plating film and the copper foils in the non-forming part of the electrolytic plating film are removed; and via conductors (60F, 60S) and conductor layers (58F, 58S) are formed (FIG. 6C).

Figure 7A:
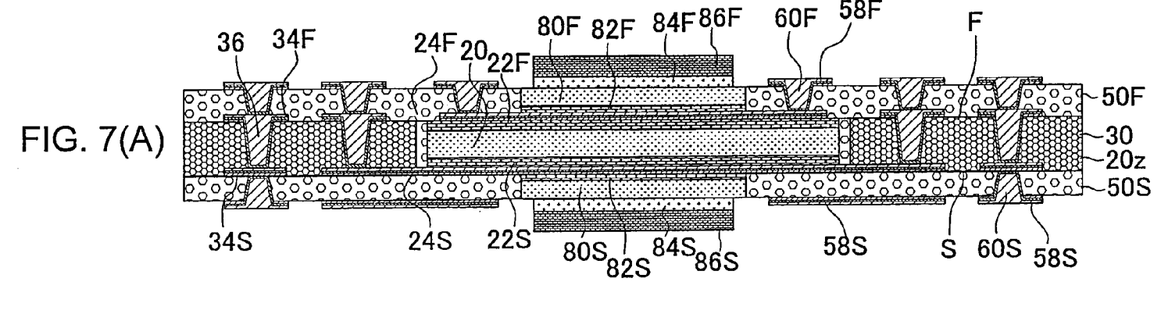
FIGS. 7(A) and 7(B) illustrate manufacturing process diagrams of the flex-rigid wiring board of the first embodiment.

(14) A solder resist layer (84F) is formed on the coverlay (80F), and further, a release layer (86F) is formed on the solder resist layer (84F). Similarly, a solder resist layer (84S) is formed on the coverlay (80S), and further, a release layer (86S) is formed on the solder resist layer (84S) (FIG. 7A).

Figure 7B:
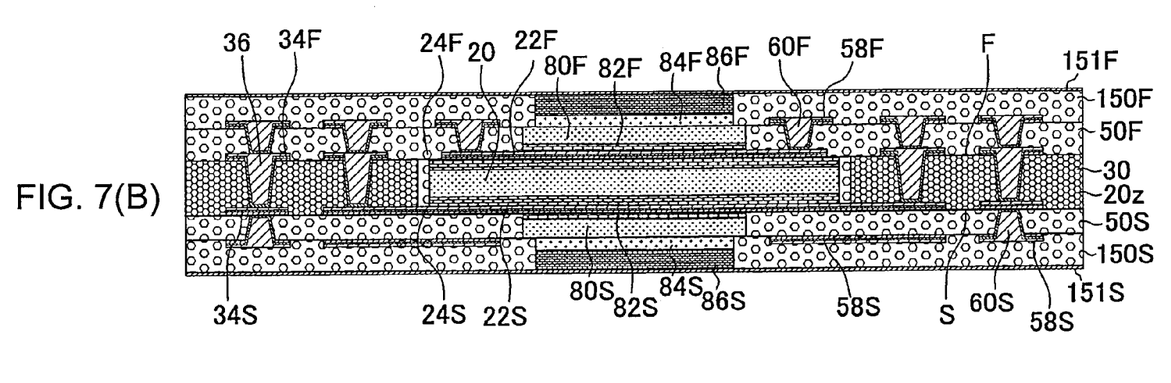

(15) An interlayer resin insulating layer (150F) is provided in a horizontal direction of the solder resist layer (84F) and the release layer (86F); an interlayer resin insulating layer (150S) is provided in a horizontal direction of the solder resist layer (84S) and the release layer (86S); and copper foils (151F, 151S) are laminated on the interlayer resin insulating layers (FIG. 7B).

Figure 8A:
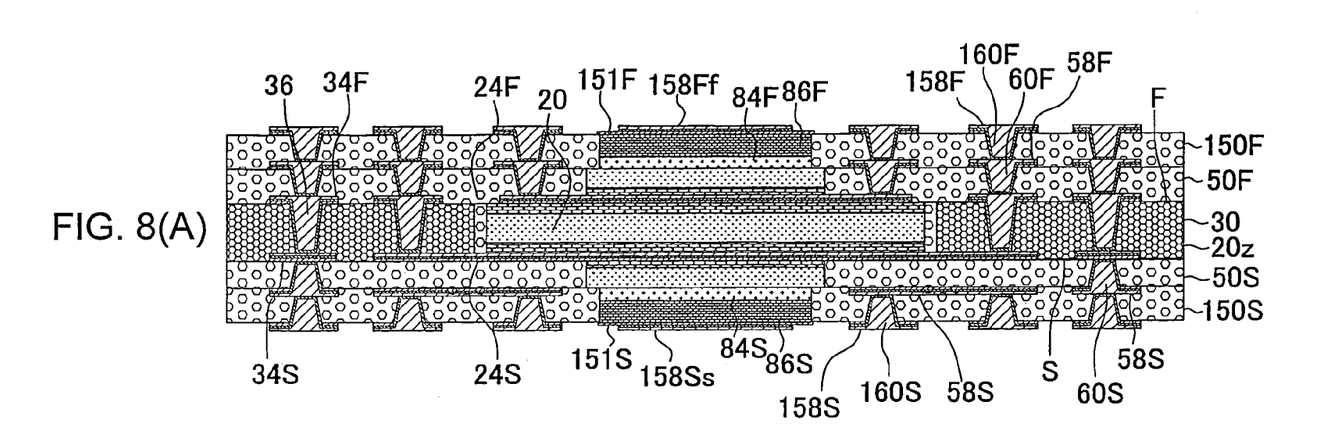
FIGS. 8(A) and 8(B) illustrate manufacturing process diagrams of the flex-rigid wiring board of the first embodiment.

(16) Similar to the process in which FIG. 6C is referenced, conductor layers (158F, 158S) are formed on the interlayer resin insulating layers (150F, 150S), and further, via conductors (160F, 160S) that penetrate through the interlayer resin insulating layers (150F, 150S) are formed. On the release layers (86F, 86S), release conductors (158Ff, 158Ss) are formed in a state in which the copper foil (151F) is exposed at end parts (FIG. 8A).

Figure 8B:
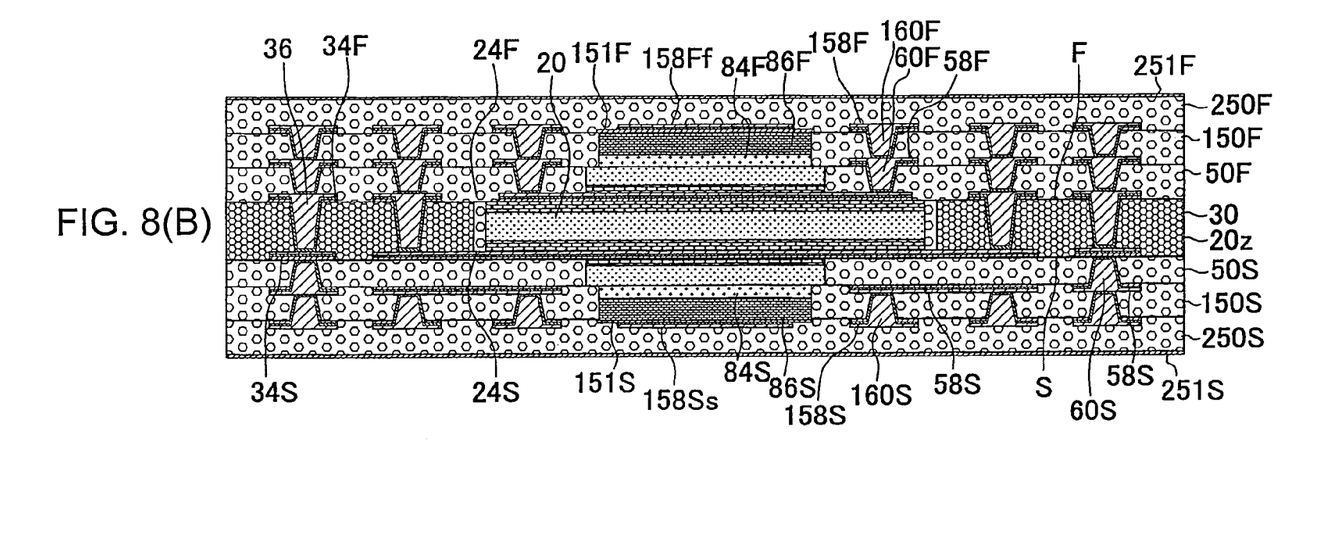

(17) On the interlayer resin insulating layers (150F, 150S) and on the release conductors (158Ff, 158Ss), interlayer resin insulating layers (250F, 250S) and copper foils (251F, 251S) are laminated (FIG. 8B).

Figure 9A:
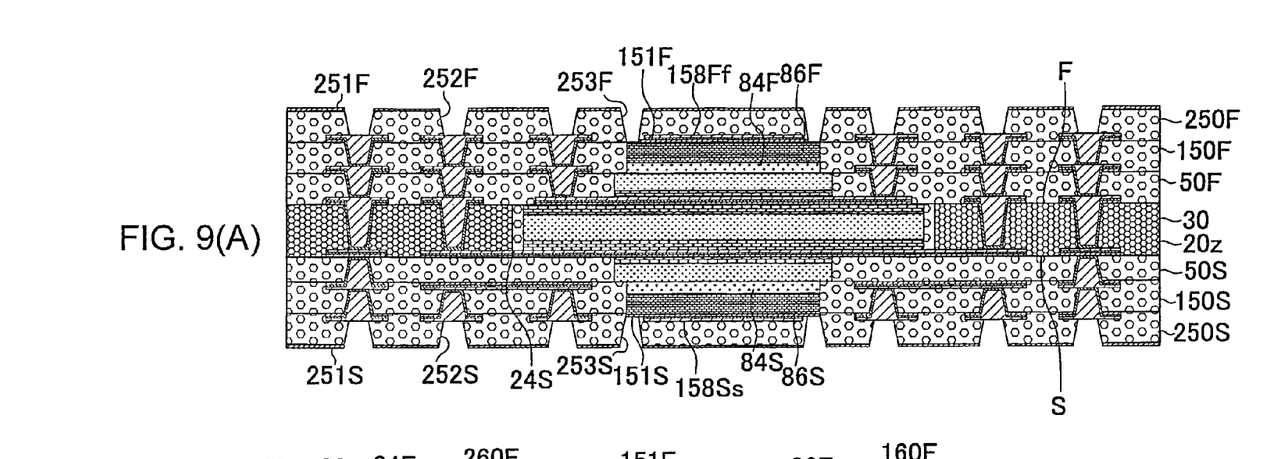
FIGS. 9(A) and 9(B) illustrate manufacturing process diagrams of the flex-rigid wiring board of the first embodiment.

(18) At predetermined positions of the interlayer resin insulating layers (250F, 250S), openings (252F, 252S) for vias are formed using laser; and at the same time, cut openings (253F, 253S) having a rectangular shape in plan view reaching the copper foil (151F) of outer peripheries of the release conductors (158Ff, 158Ss) are formed (FIG. 9A).

Figure 9B:
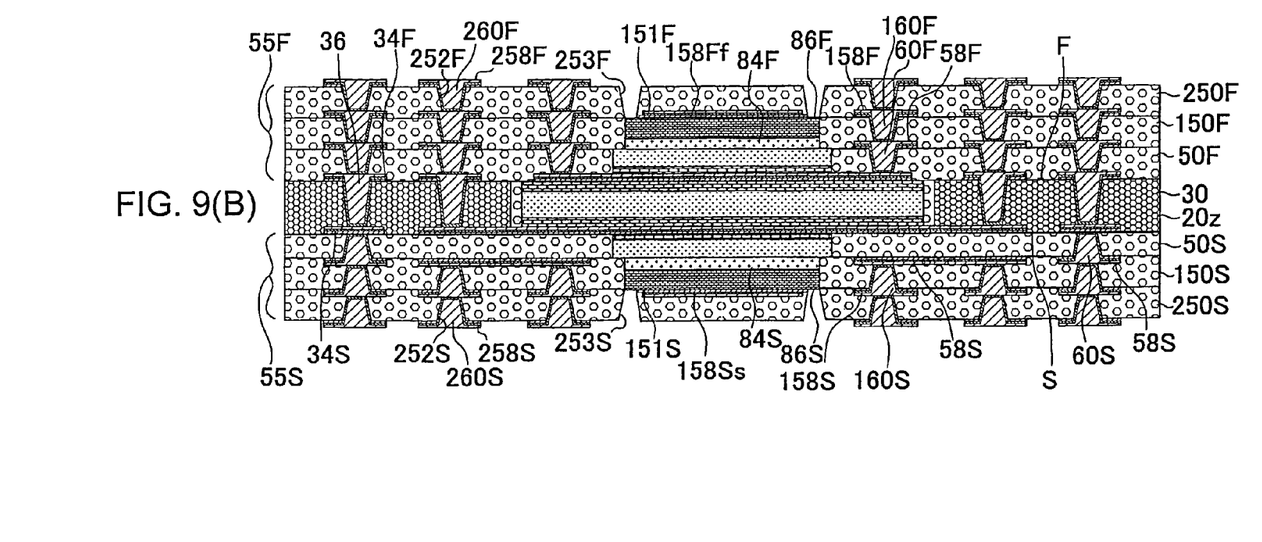

(19) Similar to the process in which FIG. 6C is referenced, conductor layers (258F, 258S) are formed on the interlayer resin insulating layers (250F, 250S), and further, via conductors (260F, 260S) that penetrate through the interlayer resin insulating layers (250F, 250S) are formed. The copper foil (151F) at lower ends of the cut openings (253F, 253S) is removed and the release layers (86F, 86S) are exposed (FIG. 9B).

Figure 10A:
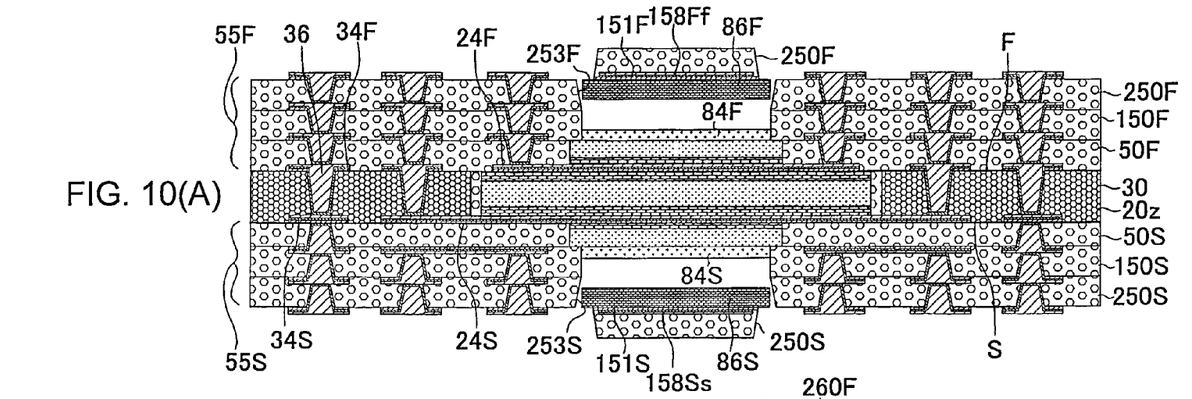
FIGS. 10(A) and 10(B) illustrate manufacturing process diagrams of the flex-rigid wiring board of the first embodiment.

(20) The release layers (86F, 86S) and the interlayer resin insulating layers (250F, 250S), on the solder resist layers (84F, 84S), are removed (FIG. 10A).

Figure 10B:
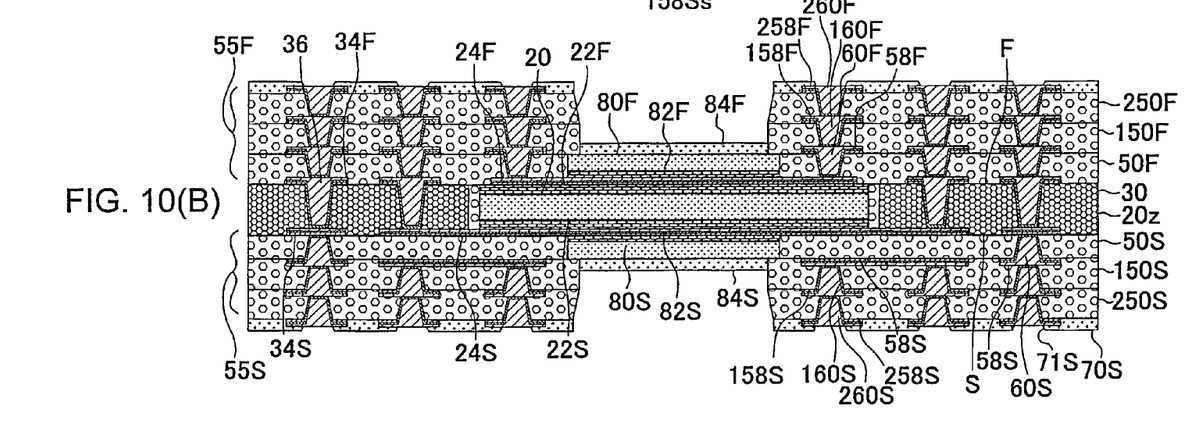

(21) An upper side solder resist layer (70F) is formed on the upper side build-up layer, and a lower side solder resist layer (70S) is formed on the lower side build-up layer (FIG. 10B). The solder resist layer (70F) has an opening (71F) that exposes the uppermost conductor layer and the uppermost via conductor; and the solder resist layer (70S) has an opening (71S) that exposes the lowermost conductor layer and the lowermost via conductor. In the openings (71F, 71S), a nickel plating layer and a gold plating layer are formed (not illustrated in the drawings). Other than the nickel-gold layers, nickel-palladium-gold layers and an OSP coating film may also be formed.

Unlike a completed flex substrate sandwiched by interlayer resin insulating layers of rigid substrates, in the first embodiment, the flex substrate and the rigid substrates are simultaneously built up on the carrier (12z). Therefore, it is possible to adopt a structure in which the via conductors (60F, 60S) do not penetrate the coverlay and the interlayer resin insulating layer, but only penetrate the interlayer resin insulating layer. As a result, the pad parts of the via conductor can be miniaturized and the flex-rigid wiring board can be formed to have a fine pitch. Without penetrating through the coverlay, the via conductor penetrates through only the interlayer resin insulating layer. Therefore, the coverlay does not significantly enter into the rigid substrates so that interlayer variations of the rigid substrates are reduced, and further, restriction in wiring design in order to avoid the coverlay is reduced.

A via conductor that connects the flex substrate and the rigid substrates is provided in a cover layer of wiring of the flex substrate. Therefore, the via conductor penetrates through an insulating layer and the cover layer that form the rigid substrates, and the via conductor becomes large in size so that it is difficult to form via conductors at a fine pitch. Further, the cover layer enters into the rigid substrates. Therefore, interlayer variations of the rigid substrates become large, and further, wiring design is subject to restrictions in order to avoid the cover layer.

A flex-rigid wiring board according to an embodiment of the present invention and a method for manufacturing the flex-rigid wiring board according to an embodiment of the present invention are capable of allowing fine pitch formation and.

A flex-rigid wiring board according to an embodiment of the present invention includes: a flexible substrate that is provided with an upper surface and a lower surface, and has an upper surface side conductor pattern and a lower surface side conductor pattern; a non-flexible substrate that is arranged in a horizontal direction of the flexible substrate, is provided with the upper surface and the lower surface, and has an upper surface side conductor pattern and a lower surface side conductor pattern; an upper surface side insulating layer that covers the upper surface of the flexible substrate and the upper surface of the non-flexible substrate, and exposes at least a portion of the flexible substrate; and a lower surface side insulating layer that covers the lower surface of the flexible substrate and the lower surface of the non-flexible substrate, and exposes at least a portion of the flexible substrate. The upper surface side conductor pattern of the flexible substrate and the upper surface side conductor pattern of the non-flexible substrate are non-embedded wirings that are exposed from the flexible substrate and the non-flexible substrate; and the lower surface side conductor pattern of the flexible substrate and the lower surface side conductor pattern of the non-flexible substrate are embedded wirings that are embedded in the flexible substrate and the non-flexible substrate. In the present invention, the non-embedded wiring refers to a wiring in which a side surface of a conductor pattern is completely exposed from a substrate; and the embedded wiring refers to a wiring in which at least a portion of a side surface of a conductor pattern is embedded in a substrate.

In a flex-rigid wiring board according to an embodiment of the present invention, the lower surface side conductor pattern of the flexible substrate and the lower surface side conductor pattern of the non-flexible substrate are embedded wirings that are embedded in the flexible substrate and the non-flexible substrate. That is, the flexible substrate can be provided by using a support plate to form an embedded wiring on the support plate and embedding the embedded wiring in the flexible substrate. Therefore, since the embedded wiring can be provided in the non-flexible substrate in a state without being covered by a covering layer, without being affected by interlayer variations, a fine pattern can be easily formed, and superior conduction reliability of the fine pattern can also be obtained. Further, since the embedded wiring can be provided in the non-flexible substrate in the state without being covered by a covering layer, a configuration can be adopted in which a via does not penetrate a covering layer and an insulating layer but only penetrates the insulating layer. As a result, the via can be miniaturized and the flex-rigid wiring board can be formed to have a fine pitch. Since the via penetrates through only the insulating layer without penetrating through the covering layer, the covering layer does not significantly enter into the rigid substrates so that interlayer variations of the rigid substrates are reduced, and further, restriction in wiring design in order to avoid the covering layer is reduced.

Obviously, numerous modifications and variations of the present invention are possible in light of the above teachings. It is therefore to be understood that within the scope of the appended claims, the invention may be practiced otherwise than as specifically described herein.

What is claimed is:

1. A flex-rigid wiring board, comprising:
a flexible substrate comprising a base material layer; and
a non-flexible substrate comprising an insulating substrate and positioned such that the insulating substrate of the non-flexible substrate is extending in a horizontal direction of the base material layer of the flexible substrate,
wherein the flexible substrate and non-flexible substrate comprise a first wiring layer comprising a plurality of non-embedded wirings formed on a first surface of the insulating substrate in the non-flexible substrate and extending on the base material layer of the flexible substrate, and a second wiring layer comprising a plurality of embedded wirings embedded in a second surface of the insulating substrate in the non-flexible substrate and extending on the base material layer of the flexible substrate, the non-flexible substrate comprises a first insulating layer formed on the first surface of the insulating substrate in the non-flexible substrate and having an opening portion exposing at least a portion of the first wiring layer on the base material layer in the flexible substrate, and a second insulating layer formed on the second surface of the insulating substrate in the non-flexible substrate and having an opening portion exposing at least a portion of the second wiring layer on the base material layer in the flexible substrate.

2. The flex-rigid wiring board according to claim 1, wherein the plurality of non-embedded wirings of the first wiring layer includes a first conductor pattern formed on the base material layer of the flexible substrate and a first conductor pattern formed on the first surface of the insulating substrate in the non-flexible substrate, and the plurality of embedded wirings of the second wiring layer includes a second conductor pattern formed on the base material layer of the flexible substrate and a second conductor pattern embedded in the second surface of the insulating substrate in the non-flexible substrate.

3. The flex-rigid wiring board according to claim 2, wherein the second wiring layer is formed such that the second wiring layer has a conductor portion connecting the second conductor pattern of the flexible substrate and the second conductor pattern of the non-flexible substrate across the flexible substrate and non-flexible substrate.

4. The flex-rigid wiring board according to claim 3, wherein the flexible substrate comprises a coverlay layer formed in the opening portion of the first insulating layer such that the coverlay layer is covering a portion of the first wiring layer on the base material layer in the flexible substrate.

5. The flex-rigid wiring board according to claim 3, wherein the flexible substrate comprises a coverlay layer formed in the opening portion of the first insulating layer such that the coverlay layer is covering a portion of the first wiring layer on the base material layer in the flexible substrate, and the non-flexible substrate comprises a via conductor formed in the first insulating layer such that the via conductor is connected to a portion of the first wiring layer on the base material layer of the flexible substrate.

6. The flex-rigid wiring board according to claim 2, wherein the flexible substrate comprises a coverlay layer formed in the opening portion of the first insulating layer such that the coverlay layer is covering a portion of the first wiring layer on the base material layer in the flexible substrate.

7. The flex-rigid wiring board according to claim 2, wherein the flexible substrate comprises a coverlay layer formed in the opening portion of the first insulating layer such that the coverlay layer is covering a portion of the first wiring layer on the base material layer in the flexible substrate, and the non-flexible substrate comprises a via conductor formed in the first insulating layer such that the via conductor is connected to a portion of the first wiring layer on the base material layer of the flexible substrate.

8. The flex-rigid wiring board according to claim 1, wherein the flexible substrate comprises a coverlay layer formed in the opening portion of the first insulating layer such that the coverlay layer is covering a portion of the first wiring layer on the base material layer in the flexible substrate.

9. The flex-rigid wiring board according to claim 1, wherein the flexible substrate comprises a coverlay layer formed in the opening portion of the first insulating layer such that the coverlay layer is covering a portion of the first wiring layer on the base material layer in the flexible substrate, and the non-flexible substrate comprises a via conductor formed in the first insulating layer such that the via conductor is connected to a portion of the first wiring layer on the base material layer of the flexible substrate.

10. The flex-rigid wiring board according to claim 1, wherein the plurality of non-embedded wirings of the first wiring layer includes a plurality of first pad portions and a plurality of first line portions formed on the base material layer in the flexible substrate such that the first pad portions are connected to the first line portions, respectively, and the plurality of embedded wirings of the second wiring layer includes a plurality of second pad portions formed in the insulating substrate of the non-flexible substrate and a plurality of second line portions formed on the base material layer of the flexible substrate such that the second line portions are extending and connected to the second pad portions, respectively.

11. The flex-rigid wiring board according to claim 10, wherein the flexible substrate comprises a coverlay layer formed in the opening portion of the first insulating layer such that the coverlay layer is covering a portion of the first wiring layer on the base material layer in the flexible substrate.

12. The flex-rigid wiring board according to claim 10, wherein the flexible substrate comprises a coverlay layer formed in the opening portion of the first insulating layer such that the coverlay layer is covering a portion of the first wiring layer on the base material layer in the flexible substrate, and the non-flexible substrate comprises a via conductor formed in the first insulating layer such that the via conductor is connected to a portion of the first wiring layer on the base material layer of the flexible substrate.

13. The flex-rigid wiring board according to claim 10, wherein the nonflexible substrate comprises a plurality of via conductors formed in the first insulating layer such that the via conductors are connected to the first pad portions of the first wiring layer on the base material layer of the flexible substrate, respectively.

14. The flex-rigid wiring board according to claim 1, wherein the non-flexible substrate comprises a first rigid substrate portion and a second rigid substrate portion such that the flexible substrate is interposed between the first rigid substrate portion and the second rigid substrate portion.

15. The flex-rigid wiring board according to claim 1, wherein the flexible substrate comprises a coverlay layer formed in the opening portion of the first insulating layer such that the coverlay layer is covering a portion of the first wiring layer on the base material layer in the flexible substrate, and a bonding layer interposed between the first wiring layer and the coverlay layer such that the bonding layer is bonding the coverlay layer to the first wiring layer, and the non-flexible substrate comprises a via conductor formed in the first insulating layer such that the via conductor is connected to a portion of the first wiring layer on the base material layer of the flexible substrate.

16. A method for manufacturing a flex-rigid wiring board, comprising:
forming on a support plate a second wiring layer comprising a conductor pattern;
positioning on the support plate a base material layer for a flexible substrate and an insulating substrate for a non-flexible substrate such that the insulating substrate for the non-flexible substrate is extending in a horizontal direction of the base material layer for the flexible substrate;
embedding the second wiring layer into a second surface of the insulating substrate for the non-flexible substrate;
forming a first wiring layer on a first surface of the insulating substrate for the non-flexible substrate on an opposite side with respect to the second surface of the insulating substrate for the non-flexible substrate; and
removing the support plate from the flexible substrate and non-flexible substrate,
wherein the first wiring layer comprises a plurality of non-embedded wirings formed on the first surface of the insulating substrate for the non-flexible substrate and extending on the base material layer for the flexible substrate, and the second wiring layer comprises a plurality of embedded wirings embedded in the second surface of the insulating substrate for the non-flexible substrate and extending on the base material layer for the flexible substrate.

17. The method for manufacturing a flex-rigid wiring board according to claim 16, further comprising:
    forming a first insulating layer on the first surface of the insulating substrate for the non-flexible substrate such that the first insulating layer covers the first surface of the non-flexible substrate and has an opening portion exposing at least a portion of the first wiring layer on the base material layer of the flexible substrate; and
    forming a second insulating layer on the second surface of the insulating substrate for the non-flexible substrate such that the second insulating layer covers the second surface of the non-flexible substrate and has an opening portion exposing at least a portion of the second wiring layer on the base material layer of the flexible substrate.

18. The method for manufacturing a flex-rigid wiring board according to claim 17, further comprising:
    forming a coverlay layer in the opening portion of the first insulating layer such that the coverlay layer covers a portion of the first wiring layer on the base material layer of the flexible substrate.

19. The method for manufacturing a flex-rigid wiring board according to claim 17, further comprising:
    forming a coverlay layer in the opening portion of the first insulating layer such that the coverlay layer covers a portion of the first wiring layer on the base material layer of the flexible substrate; and
    forming a via conductor in the first insulating layer such that the via conductor is connected to a portion of the first wiring layer on the base material layer of the flexible substrate.

20. The method for manufacturing a flex-rigid wiring board according to claim 16, wherein the second wiring layer is formed such that the second wiring layer has a conductor portion connecting a second conductor pattern of the second wiring layer formed in the flexible substrate and a second conductor pattern of the second wiring layer formed in the non-flexible substrate across the flexible substrate and non-flexible substrate.

* * * * *